United States Patent
Overweg (10) Patent No.: US 10,634,745 B2
(45) Date of Patent: Apr. 28, 2020

(54) ACTIVELY SHIELDED GRADIENT COIL ASSEMBLY FOR A MAGNETIC RESONANCE EXAMINATION SYSTEM

(71) Applicant: KONINKLIJKE PHILIPS N.V., Eindhoven (NL)

(72) Inventor: Johannes Adrianus Overweg, Uelzen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/324,585

(22) PCT Filed: Aug. 15, 2017

(86) PCT No.: PCT/EP2017/070693
§ 371 (c)(1),
(2) Date: Feb. 11, 2019

(87) PCT Pub. No.: WO2018/033548
PCT Pub. Date: Feb. 22, 2018

(65) Prior Publication Data
US 2019/0187229 A1    Jun. 20, 2019

(30) Foreign Application Priority Data
Aug. 15, 2016  (EP) .................................... 16184173

(51) Int. Cl.
*G01V 3/00* (2006.01)
*G01R 33/421* (2006.01)
*G01R 33/385* (2006.01)

(52) U.S. Cl.
CPC ....... *G01R 33/4215* (2013.01); *G01R 33/385* (2013.01)

(58) Field of Classification Search
USPC ........................................................ 324/322
See application file for complete search history.

(56) References Cited

U.S. PATENT DOCUMENTS 5,512,828 A * 4/1996 Pausch ................ G01R 33/385
                                                    324/309
5,561,371 A   10/1996 Schenck et al.
(Continued)

FOREIGN PATENT DOCUMENTS

DE    3433605 A1    3/1986
DE    3900725 A1    7/1990
(Continued)

OTHER PUBLICATIONS

Carlson et al "Design and Evaluation of Shielded Gradient Coils" MRM 26(1992) p. 191-206.
(Continued)

*Primary Examiner* — Rodney E Fuller (57) ABSTRACT

A gradient coil assembly for a magnetic resonance examination system and comprises a conical end-flange surface between the primary cylindrical surface and the shield cylindrical surface at their adjacent axial ends. Interconnecting winding portions between the primary windings and the shield windings disposed on the conical surface and serially connecting at least some of the shield windings to some of the primary windings. This tapered connection reduces the radially outward stray gradient magnetic field. The winding portions over the conical surface are largely insensitive to discretisation errors.

9 Claims, 5 Drawing Sheets

(56) References Cited

U.S. PATENT DOCUMENTS

| | | | |
|---|---|---|---|
| 7,605,587 B2 | 10/2009 | Takeshima | |
| 9,435,869 B2 | 9/2016 | Konijn et al. | |
| 2002/0072666 A1* | 6/2002 | Overweg | G01R 33/3806 600/410 |
| 2005/0198812 A1* | 9/2005 | Schuster | G01R 33/385 29/606 |
| 2007/0216409 A1 | 9/2007 | Overweg | |
| 2007/0216411 A1 | 9/2007 | Eberler et al. | |
| 2008/0197954 A1 | 8/2008 | Groeppel et al. | |
| 2009/0066332 A1* | 3/2009 | Yatsuo | G01R 33/385 324/318 |
| 2011/0227573 A1 | 9/2011 | Konijn et al. | |
| 2014/0139219 A1 | 5/2014 | Camp | |
| 2015/0192650 A1 | 7/2015 | Takamori | |
| 2016/0139221 A1 | 5/2016 | Overweg | |

FOREIGN PATENT DOCUMENTS

| | | |
|---|---|---|
| EP | 2881750 A1 | 6/2015 |
| GB | 2467596 A | 11/2010 |
| WO | 2018033530 A1 | 2/2018 |

OTHER PUBLICATIONS

J. Leggett et al "Actively Shielded Multi-Layer Gradient Coil Designs With Improved Cooling Properties" Journal of Magnetic Resonance, vol. 165, No. 2, Dec. 1, 2003 p. 196-207.

* cited by examiner

ACTIVELY SHIELDED GRADIENT COIL ASSEMBLY FOR A MAGNETIC RESONANCE EXAMINATION SYSTEM

CROSS REFERENCE TO RELATED APPLICATIONS

This application is a U.S. national phase application of International Application No. PCT/EP2017/070693, filed on Aug. 15, 2017, which claims the benefit of EP Application Serial No. 16184173.9 filed on Aug. 15, 2016 and is incorporated herein by reference.

FIELD OF THE INVENTION

The invention pertains to a gradient coil assembly with a primary gradient coil to generate a gradient magnetic field in the magnetic resonance examination system's examination zone.

BACKGROUND OF THE INVENTION

Such a gradient coil assembly is known from the paper 'Design and evaluation of shielded gradient coils' by J. W. Carlson et at. in MRM 26 (1992) 191-206. The known actively shielded gradient coil assembly has electrical current distributions on inner and outer cylinders. The shielding requirement imposed is that the magnetic field vanishes outside of the outer cylinder. This may be achieved by interference of the magnetic gradient fields generated by the electrical current distributions on the inner and outer cylinders. That is, by this interference the magnetic gradient fields cancel outside of the outer cylinder. The electrical current distributions, or equivalently, the electrical conductor layout on the cylinders, of the known gradient coil assembly are further such that the inductance of the gradient coil assembly is minimized to reduce the power required to drive the gradient coil assembly. The international application WO2010/064197 discloses a magnetic resonance imaging system that comprises a gradient coil system. The known gradient coil system includes an inner coil, satellite coils and a shielding coil. Electrical interconnections of the satellite coil and the shield coils are provided over inclined structural flanges.

SUMMARY OF THE INVENTION

An object of the invention is to provide a gradient coil assembly which has a lower stray gradient field outside the gradient coil assembly.

This object is achieved in the gradient coil assembly for a magnetic resonance examination system and comprising:
a primary gradient coil having primary windings on a primary cylindrical surface,
a shield coil having shield windings on a shield cylindrical surface,
the shield cylindrical surface located radially outward relative to the primary cylindrical surface,
a conical end-flange surface between the primary cylindrical surface and the shield cylindrical surface at their adjacent axial ends and
interconnecting winding portions between the primary windings and the shield windings disposed on the conical surface and serially connecting at least some of the shield windings to some of the primary windings.

An insight of the invention is that the tapered interconnection formed by the winding portions over the conical surface reduces the radially outward stray gradient magnetic field. Further, it appears that the pattern of winding portions over the conical surface is largely insensitive to so-called discretisation errors. These discretisation errors arise because the discrete pattern of (physical) windings of the gradient coil assembly constitute a physical electrical current distribution that deviates from the spatially continuous computed electrical current distribution derived from the optimisation of the internal and external magnetic gradient field distributions and the power needed to drive the gradient coil assembly, as may be computed using a model of the gradient coil assembly.

As a further object of the invention, the amount of heat dissipated in the gradient coil assembly should remain limited. The model may also optimise the heat dissipation and inductance of the gradient coil assembly. Owing to such discretisation errors, stronger stray gradient magnetic field may occur, relative to the model based computed spatially continuous electrical current distribution. Hence, reducing the discretisation errors reduces unwanted stray gradient magnetic fields. These and other aspects of the invention will be further elaborated with reference to the embodiments defined in the dependent Claims.

In a preferred embodiment of the gradient coil assembly of the invention, a recessed patch of windings is disposed radially inward from the shield cylindrical surface. The windings of this recessed patch further effectively reduce the discretisation errors that would otherwise arise due to the larger spacing between the physical windings. The windings of the recessed patch reduce the stray magnetic gradient field and compensate for the effect of the discretisation errors. Reduction of these discretisation errors is most needed near the axial centre of the gradient coil assembly, that is close to or around the radially extending mid-plane about the axial centre. Notably, near this mid-plane the physical windings are relatively widely separated so that larger discretisation errors arise if no steps were taken. Notably, the provision of the recessed patch of windings serves to reduce the discretisation errors in the physical winding patterns of the transverse (x,y) shield gradients that are shaped as saddle coils. These transverse gradient coils apply a gradient magnetic field orientated transversely to the orientation of the main magnetic field.

In another embodiment of the invention, the gradient coil assembly has a z-gradient primary coil and a z-gradient shield coil. These z-gradient coils apply a gradient magnetic field orientated along the orientation of the main magnetic field.

The coaxial shield windings of the z-gradient shield coil near the centre (around the mid-plane) have a smaller diameter than the coaxial shield windings more towards the axial ends of the gradient coil assembly. In this arrangement part of the shield windings are disposed over a conical mid-flange surface of which the radius increases towards one of the axial ends of the gradient coil assembly. This conical mid-flange surface is located between the coaxial shield windings near the centre and the coaxial shield windings located towards one of the axial ends of the gradient coil assembly. In this way an increased winding density is achieved around the mid-plane so that potentially larger discretisation errors are avoided. The shield windings at the axial ends also have reduced diameter relative to the larger diameter of the shield windings located between the midplane region and those at the axial ends. Starting from the midplane of the coil first there are shield windings on a reduced diameter, then a region where the shield windings have constant large diameter and finally an end region where the diameter of the shield windings reduces towards the diameter of the primary windings.

The provision of the recessed patch of windings of the transverse (x,y)-gradient shield coil and the smaller diameter of the coaxial windings of the z-gradient shield coil achieve a lower gradient stray field. Hence, the gradient coil assembly of the invention induces less current in electrically conducting parts of the cryogenic magnet and thus transfers less power into the cooling system of a magnetic resonance examination system, so that power efficiency to maintain superconductivity in main magnet coils is improved.

Typically the conical flange surface aperture is in the range of 30-45°. A steeper angle (60° degrees or more) does not have the desired effect. A more shallow angle makes the coil less efficient, as the shield conductors then stronger counteract the field in the working volume. Further, good suppression of discretisation errors and accordingly lower gradient stray field is achieved by placing the recessed patch at 10-20 mm inward from the shield cylindrical surface. A recessed patch closer to the cylindrical surface of the rest of the shield does not effectively increase the winding density in the patch, placing the patch at a greater distance merely reduces the efficiency of the coil without further reduction of the stray field. The best suppression of the discretisation errors is obtained at approximately 15 mm inward from the shield cylindrical surface.

The invention also pertains to a magnet assembly for a magnetic resonance examination system. The magnet assembly comprises a set of main magnet coils to generate a stationary, usually spatially uniform, main magnetic field in the magnet assembly's examination zone. The examination zone usually is located within the magnet bore. The main magnet coils may be cooled to be in their superconductive state. Further, the magnet assembly is provided with a gradient coil assembly of the invention. The gradient coil assembly has a stray field. In fact, the stray field of the gradient coil may be seen as the residual stray field that remains in spite of the population of the conical end-flange and conical mid-flange surfaces with shield gradient windings and the z-gradient shield coaxial windings having reduced diameter near the mid-plane and the recessed patch of electrical conductors. The stray field may have one or more high-field regions where there is a relatively strong gradient stray field strength. The gradient coil assembly and the main magnet coils are preferably spatially arranged such that the high-field regions extend through interspaces between the main magnet coils. In this way energy dissipation into the superconductive main magnet coils is avoided and the need for additional cooling to keep the main magnet coils in their superconductive state is reduced.

With optimum magnetic decoupling between the gradient coil and the superconducting magnet windings the dissipation in the cold mass of the magnet due to induced currents can be reduced to a few hundred milliwatt. It is then no longer necessary to rely on induced currents in the magnet's radiation screen to attenuate the stray fields of the gradient coil acting on the cold mass; the shield can be made electrically non-conductive. A radiation shield where eddy-currents cannot be induced has many advantages. It does not generate unwanted fields in the imaging volume of the MRI system and it will not experience large magnetic forces in case of a magnet quench. These advantages can be exploited to engineer a radiation shield with improved performance at lower cost.

These and other aspects of the invention will be elucidated with reference to the embodiments described hereinafter and with reference to the accompanying drawing wherein

DETAILED DESCRIPTION OF THE EMBODIMENTS

Figure 1:
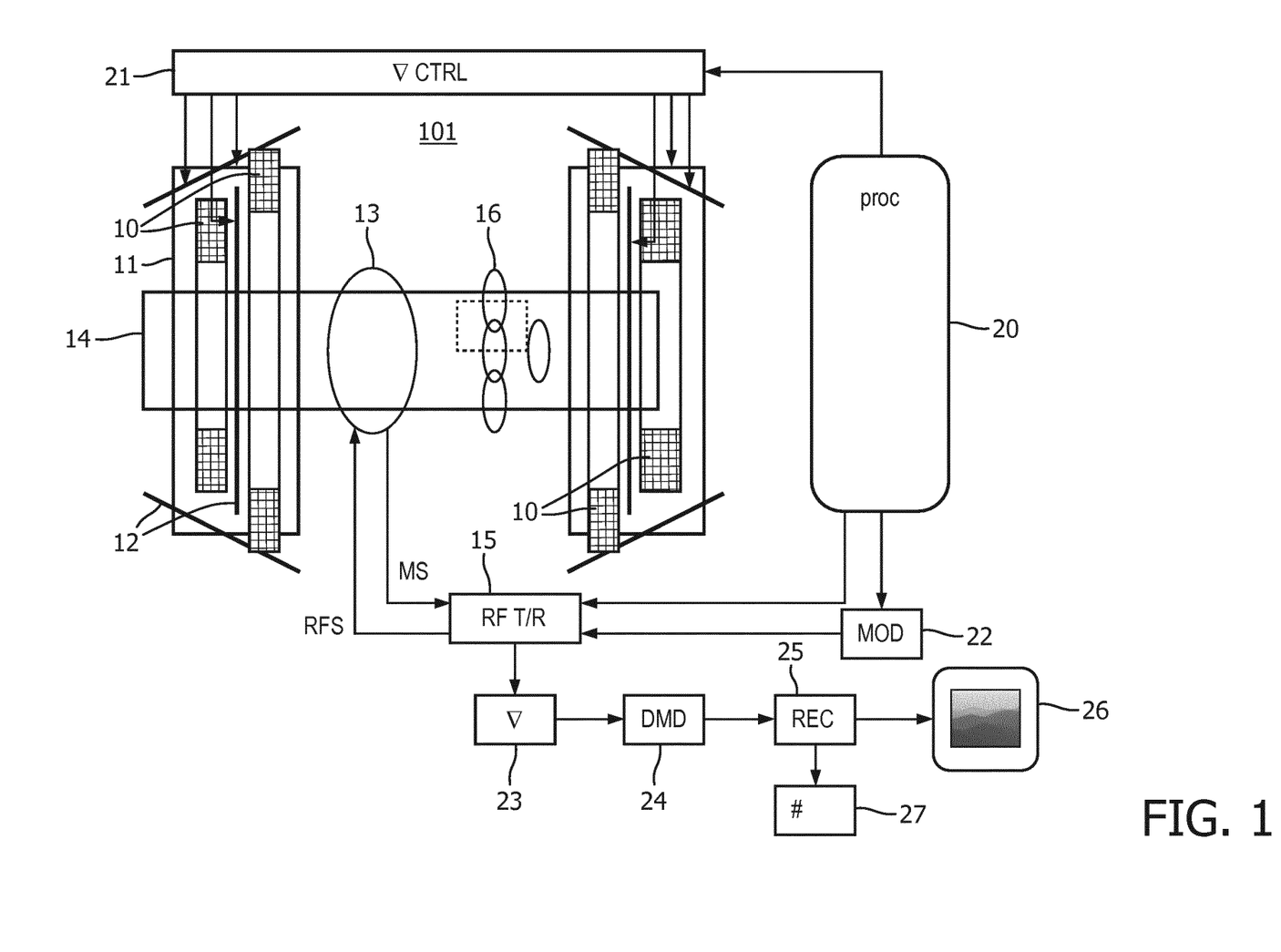
FIG. 1 shows a diagrammatic representation of a magnetic resonance examination system in which the present invention is incorporated.

FIG. 1 shows diagrammatically a magnetic resonance imaging system in which the invention is used incorporated. The magnetic resonance imaging system includes a main magnet with a set of main coils 10 whereby the steady, uniform magnetic field is generated. The main coils are constructed, for example in such a manner that they from a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible. The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array. The demodulated magnetic resonance signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

Figure 2:
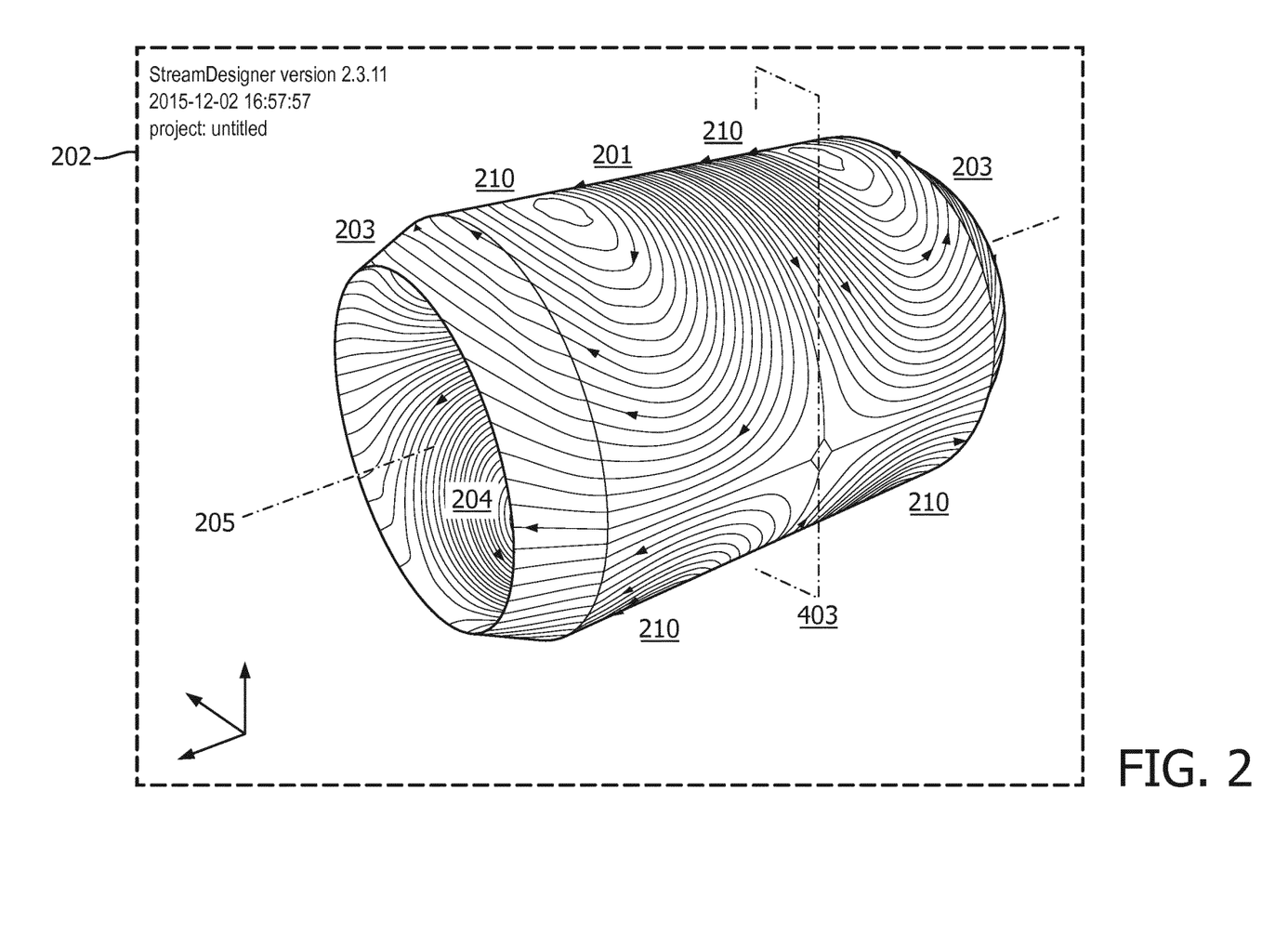
FIG. 2 shows a schematic three-dimensional view of the gradient coil assembly of the invention.
Figure 3:
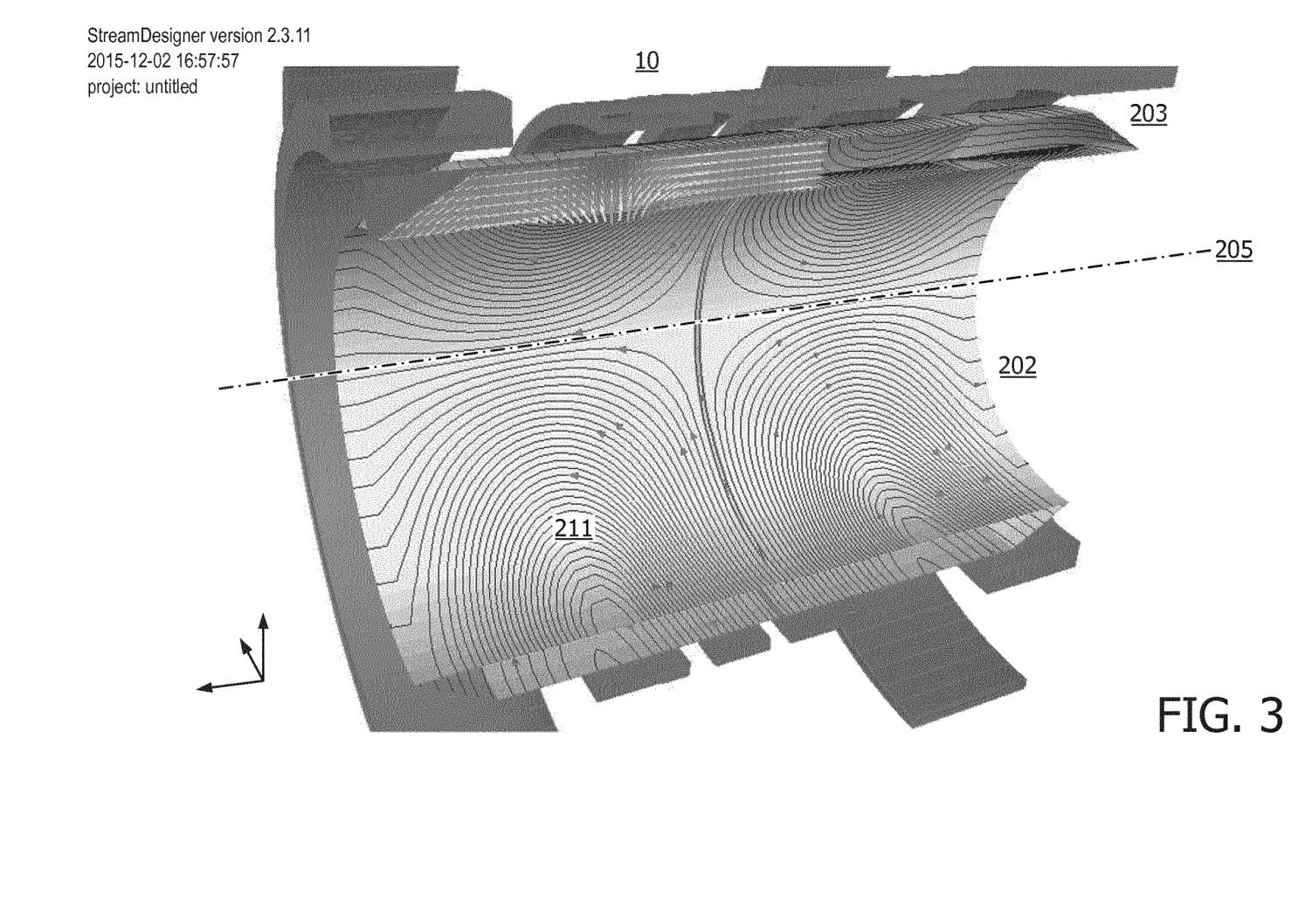
FIG. 3 shows a schematic three-dimensional view of a part of the inside of the gradient coil assembly of the invention.

FIG. 2 shows a schematic three-dimensional view of the gradient coil assembly of the invention. The primary gradient coil 201 has its primary windings on the primary cylindrical surface. The shield coil 202 has its windings on the shield cylindrical surface. Both the primary and shield cylindrical surfaces are coaxially arranged and have a common longitudinal axis 205. At each of the axial ends of the gradient coil assembly 10, a conical end-flange surface 203 is provided. These conical end-flange surfaces have an inwardly tapered shape so that the radial size of the conical end-flange surface decreases away from the axial centre of the gradient coil assembly. The respective windings of the primary and shield gradient coils are connected by the interconnecting winding portions 204 that run over the outer and inner surface of the conical end-flange surfaces, respectively, to provide an electrical series connection between the primary and shield windings. The interconnection is such that the electrical currents in the primary and shield coil are in opposite directions which achieves the shielding effect radially outward. The direction of the electrical currents is indicated by the small arrows on the windings. Further, the primary and shield gradient coils are shaped as several so-called fingerprint coil patterns 210, 211. FIG. 3 shows a schematic three-dimensional view of a part of the inside of the x or y gradient coil assembly of the invention. The gradient coil assembly is shown positioned inside of the main magnet coils 10. Cryostat structures are not shown here. FIG. 3 provides a view from within the shield cylindrical surface onto the shield windings. Only a portion of the one of the conical end-flange surfaces 203 is visible in FIG. 3.

Figure 4:
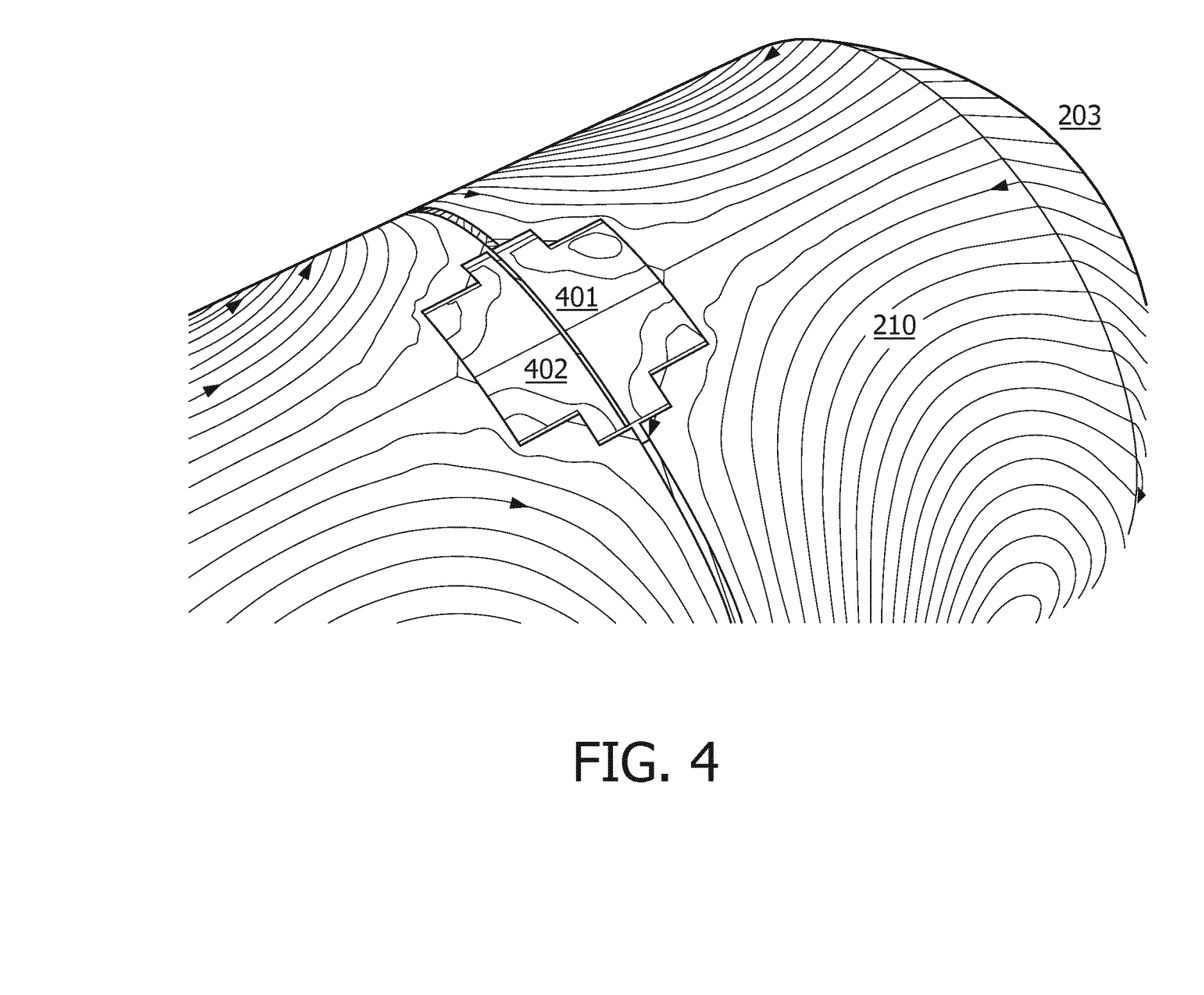
FIG. 4 shows a schematic three dimensional view of a part of the outside of the gradient coil assembly of the invention in which a recessed patch of windings is disposed.

FIG. 4 shows a schematic three dimensional view of a part of the outside of the gradient coil assembly of the invention. Shown in FIG. 4 is the recessed patch 401 of electrical conductors 402. These electrical conductors 402 of the recessed patch 401 are electrically connected in series with some of the windings, close to the recessed patch, of fingerprint coils 210 that form the shield gradient coil. The recessed patch 401 is located radially inward from the cylindrical surface on which the fingerprint pattern coil windings of the shield gradient coil are located. Because the winding of the shield gradient coil are electrically connected to their corresponding windings of the primary gradient coil, the windings of the recessed patch that are connected to those windings of the shield gradient coil near the patch, eventually these electrical conductors of the patch are electrically connected in series to some of the electrical conductor of the primary gradient coil. The recessed patch may preferably be axially positioned at the axial mid-plane 403 of the gradient coil assembly.

The winding pattern of the gradient coil is modelled by a continuous stream function over the surfaces on which the conductors are allowed to be placed. Setting suitable targets for the field in the imaging volume the external field and optionally other constraints, such as the maximum current density or the forces in the field of the main magnet, a quadratic programming optimization algorithm then generates an optimum stream function distribution. Iso-contour lines of the stream function are then taken as 3D winding trajectories. This discretization step inevitably leads to deviations from the ideal behaviour and resulting peaks in external field will lead to peaks in induced current in the conducting surfaces of the magnet. Numerical experiment shows, that the coil topology with conical flanges at the ends leads to a stream function distribution where such discretization effects remain small. Furthermore, because the deviations from the ideal current distribution are now at a much greater distance from the inner surface of the magnet than in the case with two straight cylindrical surfaces, the magnitude of the error fields due to discretization is further reduced.

A further region where coil discretization may cause peaks in external field is located close to the midplane, in the coordinate direction perpendicular to the gradient direction.

The magnitude of the discretization error can be reduced by deliberately making a cut-out in the cylindrical outer surface of the modelled shield coil and adding an auxiliary cylindrical recessed patch at a radius approximately 15 mm smaller than the radius of the shield coils. These auxiliary recessed patches can remain electrically disconnected from the rest of the shield windings. Incorporating these patches into the optimization leads to a few small current loops in these patches. The effect of the above measures is that the local density of the winding pattern has become high enough that discretization effects remain much smaller than when only the windings on the shield layer are present and as a result the peaks in external field are largely avoided. These advantages are obtained with minimal impact on coil efficiency.

Combining these above measures into one coil design, achieves that the gradient coil assembly of the invention may in operation generate less than 250 mW of heat in the stainless steel inner liner of a superconducting magnet without any damping effect of a radiation screen. The actual windings can be manufactured by any of the known gradient coil manufacturing techniques, for example by cutting and bending copper sheet metal, or bending and winding prefabricated conductors.

Figure 5:
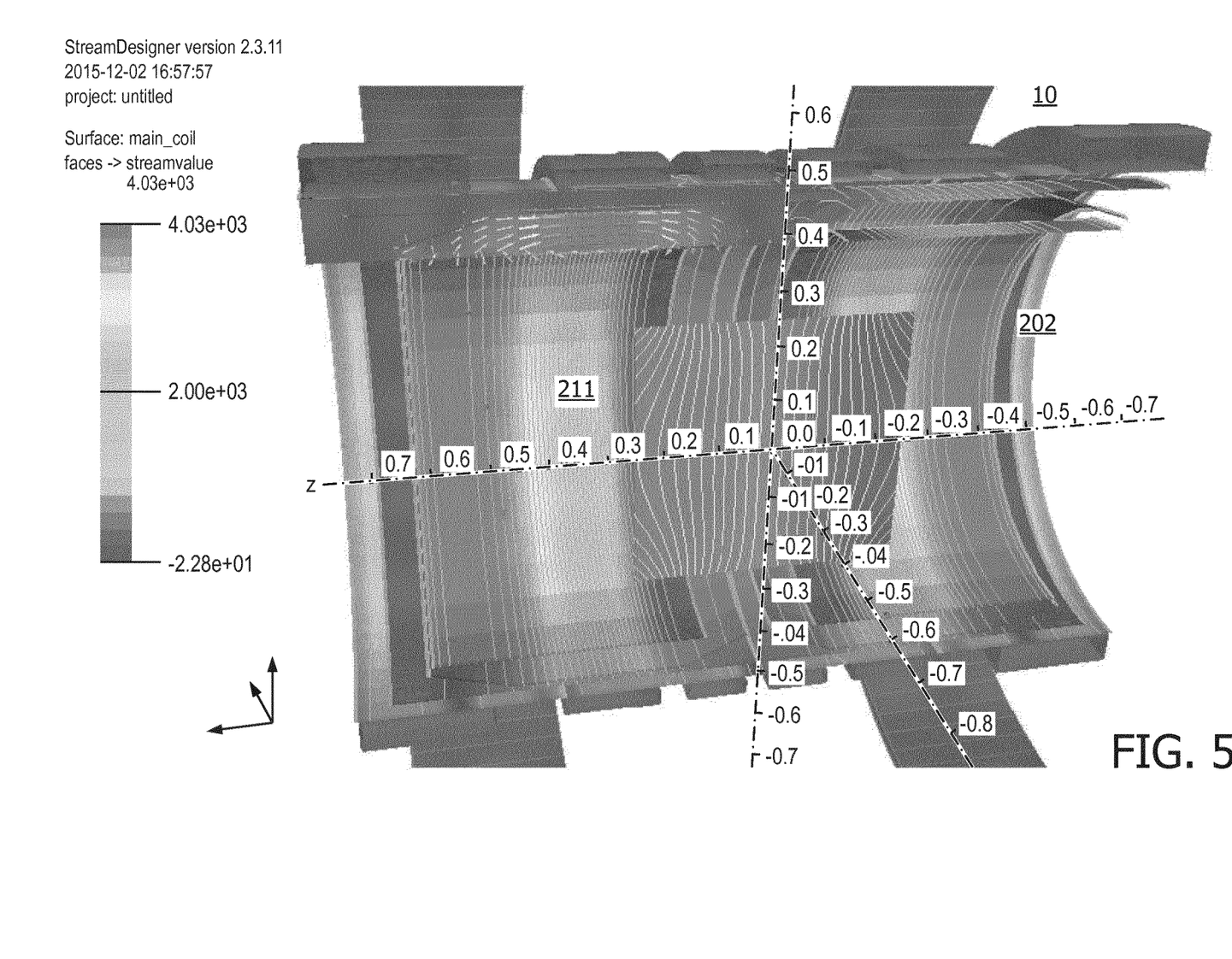
FIG. 5 shows a schematic three-dimensional view of a part of the inside of the gradient coil assembly of the invention which provides in inside view towards the recessed patch of windings.

FIG. 5 shows a schematic three-dimensional view of a part of the inside of the z-gradient coil portion of the gradient coil assembly of the invention which provides in inside view towards z-gradient shield coil. Also shown schematically in FIG. 5 is that the diameter of the winding of the shielding coil is reduced in the regions close to the midplane (z=0) and at the end of the coil. The reduction of diameters is such that these windings are located on hypothetical conical surfaces adjacent to the central cylindrical surface on which most of the shielding windings are located. These changes lead to an increase of the winding density in the regions of the coil where the winding density would otherwise have been so low that discretization errors would have led to a large increase in external field. Optimized shaping of the shield coil envelope makes it possible to reduce the dissipation in the stainless steel liner of the cold mass to less than 150 mW at 1 kHz and 400 mW in the high-frequency limit at gradient amplitude 10 mT/m. To compare, for a conventional straight cylindrical shield coil, this dissipation would be in excess of 50 W. Similar results can be obtained if the diameter of the shield turn windings is gradually reduced towards the central plane and towards the end of the coil not exactly following a conical shape.

The invention claimed is:

1. A gradient coil assembly for a magnetic resonance examination system and comprising:
   a primary gradient coil having primary windings on a primary cylindrical surface,
   a shield coil having shield windings on a shield cylindrical surface,
   the shield cylindrical surface located radially outward relative to the primary cylindrical surface,
   a conical end-flange surface between the primary cylindrical surface and the shield cylindrical surface at their adjacent axial ends,
   interconnecting winding portions between the primary windings and the shield windings disposed on the conical surface and serially connecting at least some of the shield windings to some of the primary windings and wherein
   the shield coil is provided which a recessed patch of electrical conductors located radially inward relative to the shield cylindrical surface, and the electrical conductors of the patch are electrically connected in series to some of the electrical conductors of the primary gradient coil.

2. The gradient coil assembly of claim 1, wherein the shield coil of a transverse gradient coil is provided which a recessed patch of electrical conductors located radially inward relative to the shield cylindrical surface.

3. The gradient coil assembly of claim 2, wherein the recessed patch's inward radial position is in the range of 10-20 mm.

4. The gradient coil assembly as of claim 3, wherein the recessed patch's inward radial position is in a distance of substantially 15 mm from the shield cylindrical surface.

5. The gradient coil assembly of claim 1, further comprising a z-gradient primary coil and a z-gradient shield coil, the z-gradient shield coil having:
   coaxial shield windings formed by azimuthal coil loops,
   a centre group of the coaxial shield windings located near the assembly's axial centre and a peripheral group of coaxial shield windings located in the assembly's axial periphery and
   the coaxial shield windings of the centre group having a smaller diameter than the coaxial shield windings in the peripheral group.

6. The gradient coil assembly of claim 5, wherein a conical mid-flange surface is provided between the centre group and the peripheral group and the coaxial shield windings of the centre group and the coaxial shield windings of the peripheral group are serially connected by interconnecting centre-windings disposed on the conical mid-flange surface.

7. The gradient coil assembly of claim 1, wherein the conical flange surface's aperture in the range of 30°-45°.

8. The gradient coil assembly of claim 4, wherein the recessed patch is located axially near the assembly's axial center.

9. A magnet assembly for a magnetic resonance examination system comprising:
   a set of main magnet coils with main windings and a gradient coil assembly, the gradient coil including:
   primary gradient coil having primary windings on a primary cylindrical surface,
   a shield coil having shield windings on a shield cylindrical surface,
   the shield cylindrical surface located radially outward relative to the primary cylindrical surface,
   a conical end-flange surface between the primary cylindrical surface and the shield cylindrical surface at their adjacent axial ends,
   interconnecting winding portions between the primary windings and the shield windings disposed on the conical surface and serially connecting at least some of the shield windings to some of the primary windings and wherein
   the shield coil is provided which a recessed patch of electrical conductors located radially inward relative to the shield cylindrical surface, and the electrical conductors of the patch are electrically connected in series to some of the electrical conductors of the primary gradient coil,
   the gradient coil having a gradient stray field having one or more radially extending high-field regions and
   the gradient coil assembly being spatially arranged with respect to the main magnet coils so that the high-field regions extend through interspaced between the main magnet coils.

* * * * *